United States Patent
Shiu et al.

(10) Patent No.: US 6,624,767 B1
(45) Date of Patent: Sep. 23, 2003

(54) DATA BUFFER STRUCTURE FOR ASYNCHRONOUSLY RECEIVED PHYSICAL CHANNELS IN A CDMA SYSTEM

(75) Inventors: Da-Shan Shiu, San Jose, CA (US); Avneesh Agrawal, San Jose, CA (US); Daisuke Terasawa, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 506 days.

(21) Appl. No.: 09/655,666

(22) Filed: Sep. 6, 2000

(51) Int. Cl.[7] .................................................. H03M 7/00
(52) U.S. Cl. ........................................... 341/81; 341/82
(58) Field of Search ............................. 341/81, 82, 83; 374/341; 714/755

(56) References Cited

U.S. PATENT DOCUMENTS 6,223,319 B1 * 4/2001 Ross .......................... 714/755
6,307,901 B1 * 10/2001 Yu et al. ..................... 375/341

\* cited by examiner

*Primary Examiner*—Brian Young
(74) *Attorney, Agent, or Firm*—Philip R. Wadsworth; Charles D. Brown; George C. Pappas

(57) ABSTRACT

A receiver unit for use in a CDMA system and including a channel processor, a buffer, and a data processor. The channel processor processes samples for one or more physical channels for each time interval to provide symbols. The buffer is operated as a number of memory banks. Each memory bank is associated with a respective time interval and stores symbols associated with that time interval. The data processor retrieves symbols for a particular "traffic" from one or more memory banks and processes the retrieved symbols. For the W-CDMA system, each traffic includes one or more radio frames for a particular transmission time interval. The receiver unit typically further includes a controller that directs the storage and retrieval of symbols to and from the memory banks and a decoder that decodes symbols processed by the data processor. For each time interval, radio frames for physical channels received starting within that time interval can be stored to permutated locations of designated sections of the memory bank. Radio frames associated with a particular CCTrCH can be stored to contiguous sections of the memory bank. Symbols for a particular traffic can be retrieved from one or more memory banks in permutated order.

33 Claims, 8 Drawing Sheets

DATA BUFFER STRUCTURE FOR ASYNCHRONOUSLY RECEIVED PHYSICAL CHANNELS IN A CDMA SYSTEM

CROSS REFERENCE TO RELATED APPLICATIONS

This application is related to U.S. patent application Ser. No. 09/657,220 entitled "METHOD AND APPARATUS FOR PROCESSING A RECEIVED TRANSMISSION BASED ON PROCESSING DELAYS REQUIREMENT," filed on same day herewith, and incorporated herein by reference.

BACKGROUND OF THE INVENTION

I. Field of the Invention

The present invention relates to data communication. More particularly, the present invention relates to a novel and improved data buffer structure for storing symbols in an asynchronous CDMA system and method for efficiently processing symbols using such data buffer structure.

II. Description of the Related Art

A modern day communications system is required to support a variety of applications. One such communications system is a code division multiple access (CDMA) system that supports voice and data communication between users over a terrestrial link. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention and incorporated herein by reference.

A CDMA system is typically designed to conform to one or more standards. One such first generation standard is the "TIA/EIA/IS-95 Terminal-Base Station Compatibility Standard for Dual-Mode Wideband Spread Spectrum Cellular System," hereinafter referred to as the IS-95 standard and incorporated herein by reference. The IS-95 CDMA systems are able to transmit voice data and (albeit not efficiently) packet data. A newer generation standard that can more efficiently transmit packet data is offered by a consortium named "$3^{rd}$ Generation Partnership Project" (3GPP) and embodied in a set of documents including Document Nos. 3G TS 25.211, 3G TS 25.212, 3G TS 25.213, and 3G TS 25.214, which are readily available to the public. The 3GPP standard is hereinafter referred to as the W-CDMA standard and incorporated herein by reference.

The W-CDMA standard defines a channel structure capable of supporting a number of users and designed for efficient transmission of packet data. In accordance with the W-CDMA standard, data to be transmitted is processed as one or more "transport" channels at a higher signaling layer. The transport channels support concurrent transmission of different types of services (e.g., voice, video, data, and so on). The transport channels are then mapped to one or more "physical" channels that are assigned to a user terminal for a communication (e.g., a call).

The W-CDMA standard allows for a great deal of flexibility in the processing of the transport channels. For example, data for a particular transport channel can be coded using a convolutional code, a Turbo code, or not coded at all. Also, the data can be interleaved over one of four different time intervals (i.e., 10 msec, 20 msec, 40 msec, or 80 msec) to provide temporal diversity against deleterious path effects (e.g., fading, multipaths, and so on). Different combinations of coding scheme and interleaving interval can be selected to provide improved performance for different types of services. For example, enhanced efficiency and performance may be obtained by processing packet data using Turbo code and a long interleaving interval, which may result in longer processing delays. In contrast, voice and video data may be processed using convolutional code and a short interleaving interval since long processing delays cannot be tolerated.

A user terminal in a W-CDMA system may receive multiple transmissions (i.e., multiple transport channels) concurrently on multiple physical channels. For costs consideration, it is highly desirable to design a user terminal capable of processing multiple transmissions using a basic set of processing and storage elements. In particular, a data buffer structure that can be used to efficiently store data for multiple transport/physical channels, and to facilitate the processing of such data, is highly desirable.

SUMMARY OF THE INVENTION

The present invention provides a data buffer structure that can be used to efficiently store symbols received for one or more transport channels transmitted via one or more physical channels. The data buffer structure can be designed to match the capability of the user terminal (i.e., a particular supported peak data rate). The data buffer structure can also be operated to facilitate various required signal processing such as, for example, de-interleaving, physical channel concatenation, transport channel demultiplexing, and so on.

An aspect of the invention provides a receiver unit that can be operated to process data transmissions in a communications system (e.g., a W-CDMA system). The receiver unit includes a channel processor, a buffer, and a data processor. The channel processor processes samples for one or more physical channels for each time interval to provide symbols. The buffer couples to the channel processor and is operated as a number of memory banks. Each memory bank is associated with a respective time interval and stores symbols associated with that time interval. The data processor retrieves symbols for a particular "traffic" from one or more memory banks and processes the retrieved symbols. For the W-CDMA system, each traffic includes one or more radio frames for a particular transmission time interval (TTI). The receiver unit typically further includes a controller and a decoder. The controller directs the storage and retrieval of symbols to and from the memory banks. The decoder receives and decodes symbols processed by the data processor.

Another aspect of the invention provides a data buffer structure for storing symbols in a communications system. The structure includes a number of memory banks (e.g., at least eight memory banks for the W-CDMA system) and an address generator. Each memory bank is associated with a respective time interval and stores symbols for the associated time interval in permuted locations of the memory bank to achieve a second de-interleaving. Symbols are later retrieved from one or more memory banks in permuted order to achieve a first de-interleaving. Each memory bank is typically sized to store all symbols expected to be received from all physical channels for the associated time interval. The address generator provides memory addresses for writing and reading symbols to and from the memory banks. The address generator can be implemented to include the data structures described above, which are used to maintain track of the memory banks and the physical channels being processed. Each memory bank can be implemented with two half-banks that allow for writing of symbols to one half-bank and reading of symbols from the other half-bank.

Various aspects, embodiments, and features of the invention are described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
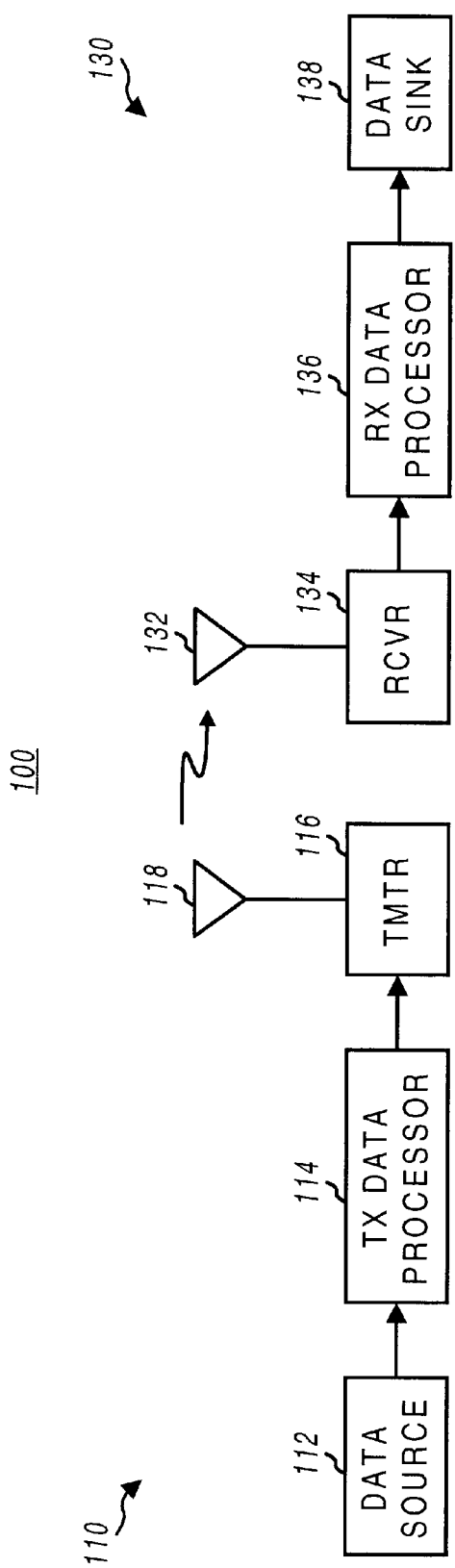
FIG. 1 is a simplified block diagram of a communications system that can implement the invention.

FIG. 1 is a simplified block diagram of a communications system 100 that can implement the invention. At a transmitter unit 110, data is sent, typically in blocks, from a data source 112 to a transmit (TX) data processor 114 that formats, codes, and processes the data to generate one or more analog signals. The analog signals are then provided to a transmitter (TMTR) 116 that (quadrature) modulates, filters, amplifies, and upconverts the signals to generate a modulated signal. The modulated signal is then transmitted via an antenna 118 to one or more receiver units.

At a receiver unit 130, the transmitted signal is received by an antenna 132 and provided to a receiver (RCVR) 134. Within receiver 134, the received signal is amplified, filtered, downconverted, (quadrature) demodulated, and digitized to generate inphase (I) and quadrature (Q) samples. The samples are then decoded and processed by a receive (RX) data processor 136 to recover the transmitted data. The decoding and processing at receiver unit 130 are performed in a manner complementary to the coding and processing performed at transmitter unit 110. The recovered data is then provided to a data sink 138.

The signal processing described above supports transmissions of voice, video, packet data, messaging, and other types of communication in one direction. A bi-directional communications system supports two-way data transmission. However, the signal processing for the other direction is not shown in FIG. 1 for simplicity.

Communications system 100 can be a code division multiple access (CDMA) system, a time division multiple access (TDMA) communications system (e.g., a GSM system), a frequency division multiple access (FDMA) communications system, or other multiple access communications system that supports voice and data communication between users over a terrestrial link. In a specific embodiment, communications system 100 is a CDMA system that conforms to the W-CDMA standard.

Figure 2A:
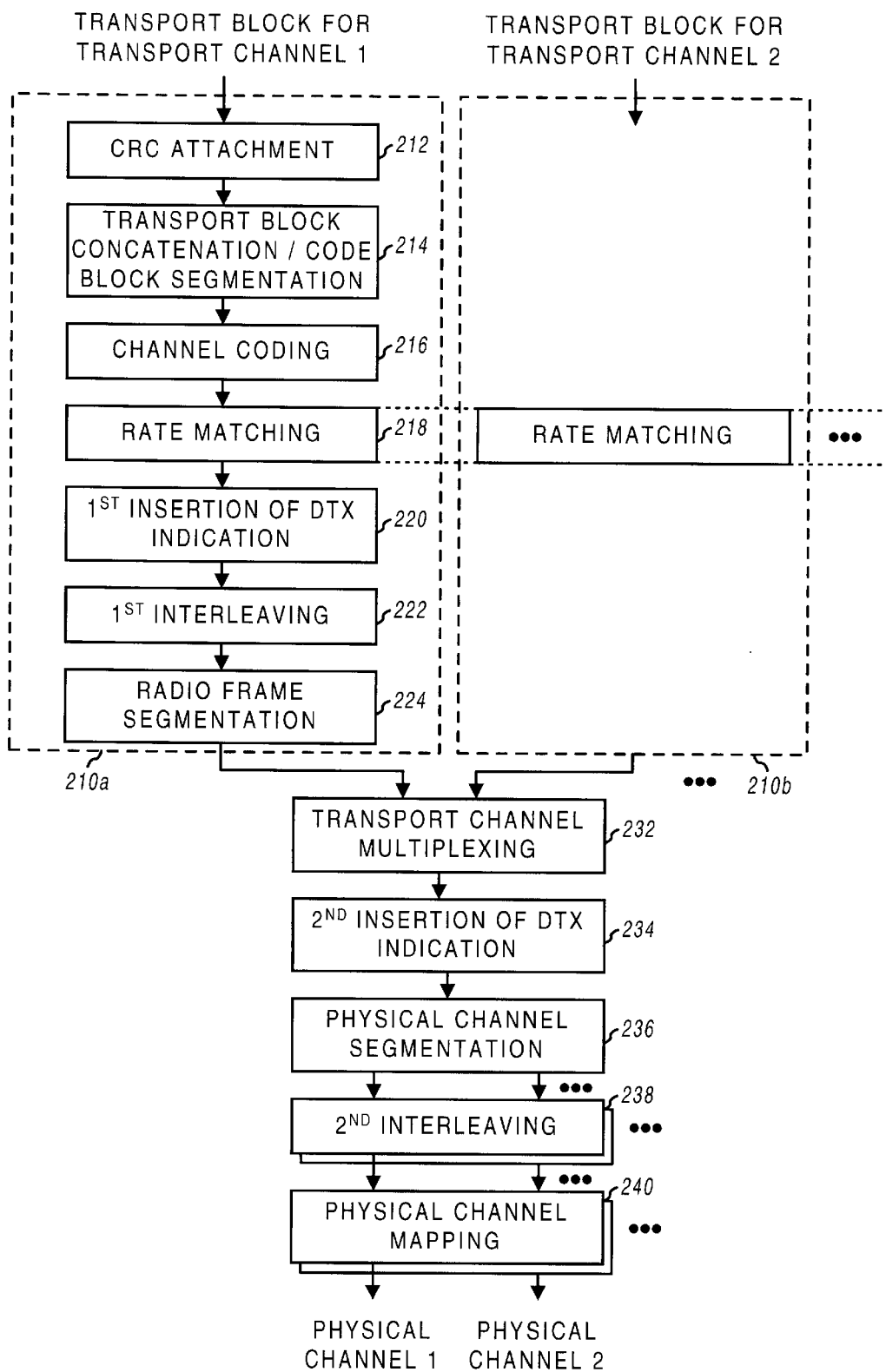
FIGS. 2A and 2B are diagrams of the signal processing at a transmitter unit and a receiver unit, respectively, for a downlink data transmission in accordance with the W-CDMA standard.

FIG. 2A is a diagram of the signal processing at the transmitter unit for a downlink data transmission in accordance with the W-CDMA standard. The downlink refers to transmission from a base station to a user terminal, and the uplink refers to transmission from the user terminal to the base station. The signal processing shown in FIG. 2A is generally performed by transmit data processor 114 in FIG. 1. The upper signaling layers of the W-CDMA system support concurrent transmission of a number of transport channels, with each transport channel capable of carrying data for a particular communication (e.g., voice, video, data, and so on). The data for each transport channel is provided, in blocks that are also referred to as transport blocks, to a respective transport channel processing section 210.

Within transport channel processing section 210, each transport block is used to calculate the cyclic redundancy check (CRC) bits, in block 212. The CRC bits are attached to the transport block and used at the receiver unit for error detection. A number of CRC coded blocks are then serially concatenated together, in block 214. If the total number of bits after concatenation is greater than the maximum size of a code block, the bits are segmented into a number of equal-sized code blocks. Each code block is then coded with a particular coding scheme (e.g., a convolutional code, a Turbo code) or not coded at all, in block 216.

Rate matching is then performed on the code bits, in block 218. Rate matching is performed in accordance with a rate-matching attribute assigned by higher signaling layers. On the uplink, bits are repeated or punctured (i.e., deleted) such that the number of bits to be transmitted matches the number of bits available. On the downlink, unused bit positions are filled with discontinuous transmission (DTX) bits, in block 220. The DTX bits indicate when a transmission should be turned off and are not actually transmitted.

The bits are then interleaved in accordance with a particular interleaving scheme to provide time diversity, in block 222. In accordance with the W-CDMA standard, the time interval over which interleaving is performed can be selected from a set of possible time intervals (e.g., 10 msec, 20 msec, 40 msec, or 80 msec). The interleaving time interval is also referred to as a transmission time interval (TTI). The TTI is a transport channel attribute and, in accordance with the W-CDMA standard, does not change over time. A physical channel can carry transport channels having different TTIs.

When the selected TTI is longer than 10 msec, the sequence of interleaved bits is segmented and mapped onto consecutive radio frames, in block 224. Each radio frame corresponds to a transmission over a particular time interval (e.g., 10 msec). In accordance with the W-CDMA standard, a sequence may be interleaved over 1, 2, 4, or 8 radio frames.

The radio frames from all active transport channel processing sections 210 are then serially multiplexed into a coded composite transport channel (CCTrCH), in block 232. DTX bits may then be inserted to the multiplexed radio frames such that the number of bits to be transmitted matches the number of bits available on the physical channel (s) used for the data transmission, in block 234. If more than one physical channel is used, the bits are segmented among the physical channels, in block 236. The bits in each radio frame of each physical channel are then interleaved to provide additional time diversity, at block 238. The interleaved radio frames are then mapped to their respective physical channels, at block 240. The subsequent signal processing to generate a modulated signal suitable for transmission to a user terminal is known in the art and not described herein.

Figure 2B:
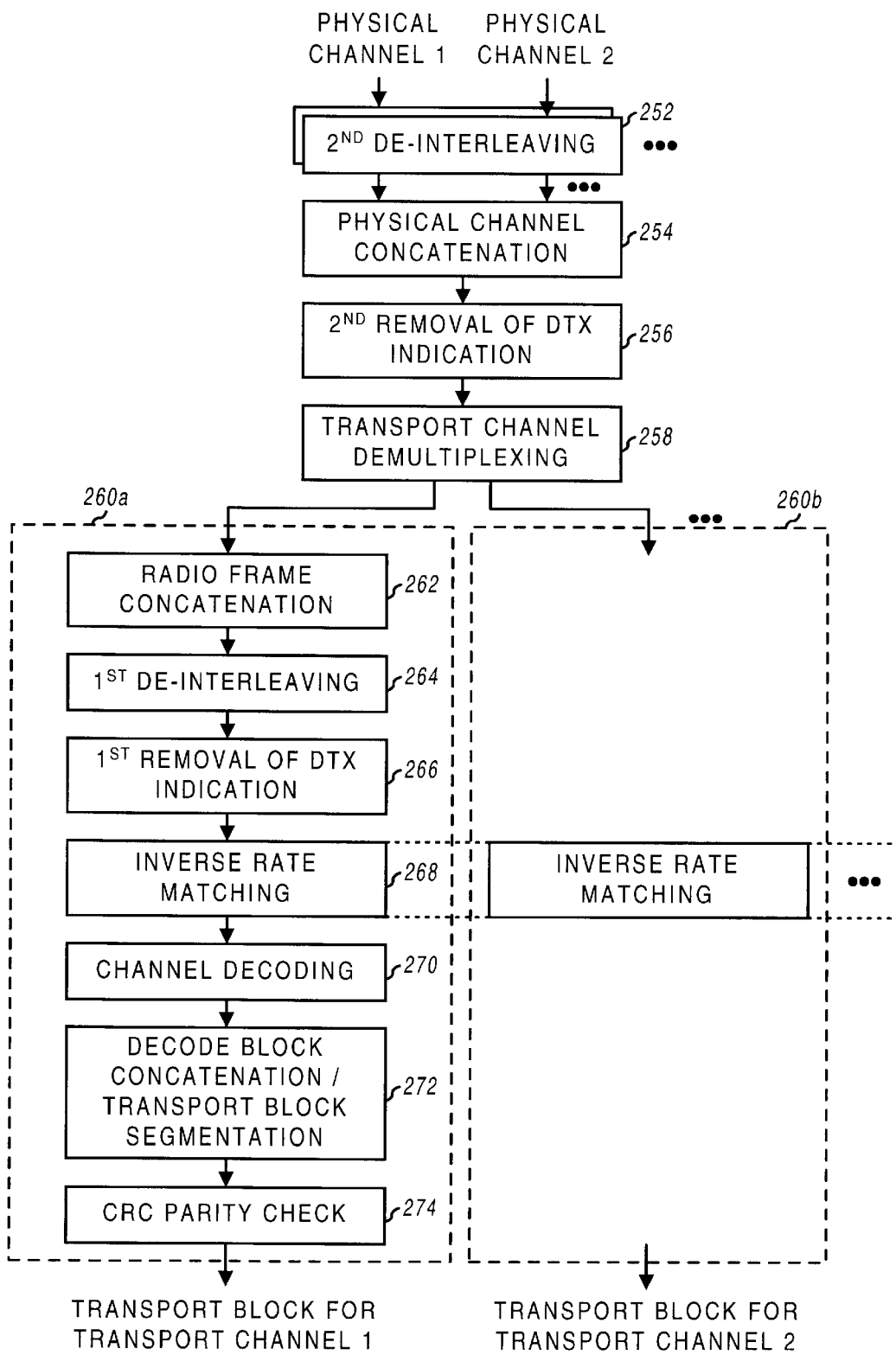

FIG. 2B is a diagram of the signal processing at the receiver unit for a downlink data transmission in accordance with the W-CDMA standard. The signal processing shown in FIG. 2B is complementary to that shown in FIG. 2A, and is generally performed by receive data processor 136 in FIG. 1. Initially, the modulated signal is received, conditioned, digitized, and processed to provide symbols corresponding to each physical channel used for the data transmission. Each symbol has a particular resolution (e.g., 4-bit) and corresponds to a transmitted bit. The symbols in each radio frame of each physical channel are de-interleaved, in block 252, and the de-interleaved symbols from all physical channels are concatenated, in block 254. For a downlink transmission, non-transmitted bits are detected and removed, in block 256. The symbols are then demultiplexed into various transport channels, in block 258. The radio frames for each transport channel are then provided to a respective transport channel processing section 260.

Within transport channel processing section 260, the radio frames are concatenated into "traffics", in block 262. Each traffic includes one or more radio frames and corresponds to a particular interleaving interval (i.e., a particular TTI) used at the transmitter unit. The symbols within each traffic are de-interleaved, in block 264, and non-transmitted symbols are removed, in block 266. Inverse rate matching is then performed to accumulate repeated symbols and insert "don't cares" for punctured bits, in block 268. Each coded block in the traffic is then decoded, in block 270. The decoded blocks are then concatenated and segmented into their respective transport blocks, in block 272. Each transport block is then checked for error using the CRC bits, in block 274.

In many communications systems including the W-CDMA system, interleaving is employed to provide temporal diversity to combat against deleterious path effects. The interleaving reduces the likelihood of receiving a string of consecutive errors due to, for example, fading, impulse noise, multipath, and so on. At the receiver unit, the received symbols are reordered and a string of symbols received in error can be effectively spread over the entire interleaving interval. Spreading the error symbols can improve the likelihood of correct decoding of all symbols received within the interleaving interval.

For enhanced flexibility and improved performance, the W-CDMA standard provides two interleaving stages. Referring back to FIG. 2A, in the first interleaving stage 222, the coded data for each transport channel is interleaved over a transmission time interval (TTI) that can be selected to be either 10 msec, 20 msec, 40 msec, or 80 msec. In the second interleaving stage 238, the data for each (10 msec) radio frame of each physical channel is further interleaved.

The selection of the TTI to use in the first interleaving stage 222 for a particular data transmission is not defined by the W-CDMA standard, and is left open as an operating parameter. Generally, longer TTIs provide enhanced temporal diversity and can be used to combat deep fades in a transmission. However, longer TTIs also equate to longer processing delays at both the transmitter and receiver units, since longer periods of data need to be buffered for the interleaving and de-interleaving. Longer TTIs are thus typically used for transmissions that are less sensitive to processing delays (e.g., traffic data, some signaling data, and so on). In contrast, shorter TTIs provide less temporal diversity, but have shorter processing delays, and are thus used for transmissions that are more sensitive to processing delays (e.g., voice, video, and so on).

The interleaving to be performed at the first and second interleaving stages is defined by the W-CDMA standard in Document No. 3G TS 25.212. For the first interleaving stage 222, the input bits are written row-by-row to an R row by C column rectangular matrix starting from the first column of the first row. The number of columns C is dependent on the selected TTI (i.e., 1, 2, 4, and 8 columns are used for TTIs of 10 msec, 20 msec, 40 msec, and 80 msec, respectively). The columns are then permutated (i.e., rearranged in a different order) based on a particular permutation pattern defined by the W-CDMA standard. The bits are then read out column-by-column, starting from the first row of the first column. The interleaving for the second stage 238 is similar to that of the first stage. However, the interleaving is performed for each radio frame (i.e., each 10 msec) of each physical channel and 30 columns are used (i.e., C=30).

The de-interleaving at the receiver unit, as shown in FIG. 2B, can be achieved using various designs. For example, to achieve the second de-interleaving 252, the symbols for each physical channel can be written to sequential locations in a memory and read out in a permutated order. In a simple design, one memory can be allocated and used for each physical channel, with the memory size being selected to store the maximum number of symbols that may be received for the physical channel. Similarly, to achieve the first de-interleaving 264, the symbols for each transport channel can be written to sequential locations in another memory and read out in a permutated order. Again, in a simple design, one memory can be allocated and used for each transport channel, with the memory size being selected to store the maximum number of symbols that may be received in the longest TTI of 80 msec.

The simple design described above is likely to be inefficient because of the flexibility afforded by the W-CDMA standard. In particular, any number of transport channels may be transmitted concurrently, and these transport channels can be mapped to any number of physical channels. Moreover, the data rate and TTI of each transport channel can take on any set of values. For the simple design described above, the memories would need to match the worst case transport and physical channels requirements, and each memory would need to be properly sized to handle the worse case scenario (i.e., the highest data rate, the longest TTI).

The W-CDMA system can be operated such that the number of data bits transmitted to a particular user terminal for each (10 msec) radio frame interval can be guaranteed to be less than or equal to a particular maximum value ($N_{MAX}$). This maximum value can be made known to the system, for example, during the session initiation. Subsequently, the number of data bits transmitted on all physical channels utilized for each radio frame interval can be guaranteed to be less than or equal to $N_{MAX}$. This operational constraint can be advantageously used to design an efficient data buffer structure, as described below.

The invention provides a data buffer structure that can be used to efficiently store the received symbols and to facilitate the required signal processing such as the first and second de-interleaving in the W-CDMA system. In accordance with the invention, a number of memory banks are provided to store the symbols received from the physical channels. Each memory bank is sized to store up to $N_{MAX}$ symbols corresponding to the maximum number of data bits to be transmitted within one radio frame interval, as guaranteed by the system. The memory banks are operated in a manner such that some required processing can be achieved in conjunction with the writing and reading of symbols to and from the memory banks.

Figure 3:
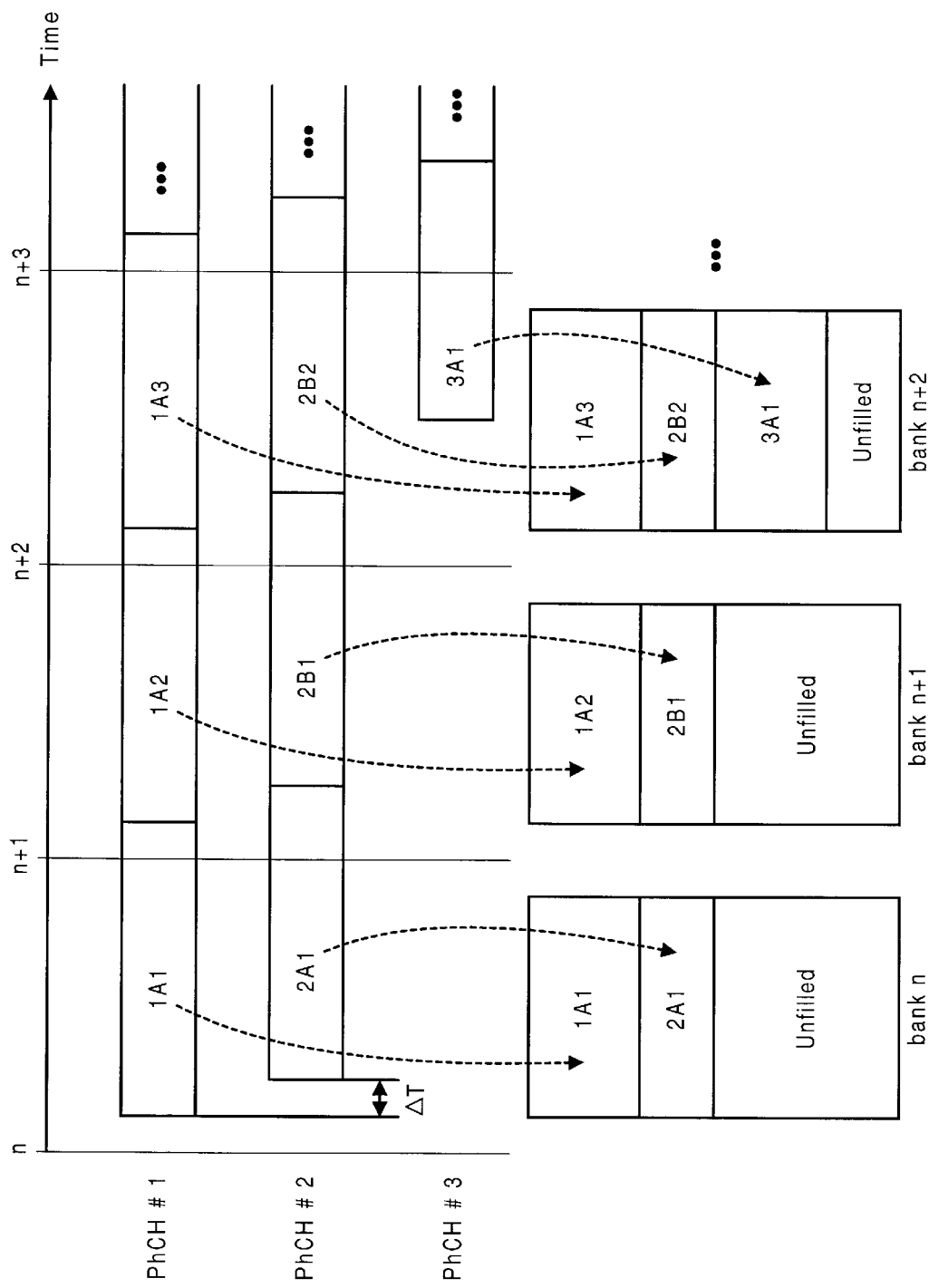
FIG. 3 is a diagram that graphically illustrates the storage of symbols received from multiple physical channels into a number of memory banks.

FIG. 3 is a diagram that graphically illustrates the storage of symbols received from multiple physical channels into a number of memory banks. The horizontal axis at the top of FIG. 3 denotes time, which is partitioned into time intervals demarcated with frame indices of n, n+1, n+2, and so on. The frame indices are marked based on an (arbitrary) timing signal generated by the receiver unit, which may not be locked to the timing of the received physical channels. Each time interval has a duration that is approximately equal to the shortest TTI of 10 msec.

The physical channels in the W-CDMA can be received with time offsets (or delays). The time offsets result from the transmission of the physical channels starting at different times. Since the physical channels in the W-CDMA system may be transmitted without a defined timing relationship, the time offsets can be of any values. As shown in FIG. 3, a time offset of ΔT exists between physical channels 1 and 2. Because of the (random) time offsets, the physical channels appear to be asynchronously received by the receiver unit.

In accordance with the invention, each time interval is associated with a memory bank used to store radio frames received starting within that time interval. Specifically, if the start of a received radio frame occurs between frame indices of n and n+1 (i.e., time interval n), that radio frame is stored to the memory bank associated with time interval n. The frame indices are used to determine the particular memory bank to store the received radio frames.

For the example shown in FIG. 3, the start of radio frames 1A1 and 2A1 received for physical channels 1 and 2, respectively, occurs between frame indices n and n+1. These radio frames are stored to respective sections of memory bank n, as indicated in FIG. 3. Similarly, the start of radio frames 1A2 and 2B1 received for physical channels 1 and 2, respectively, occurs between frame indices n+1 and n+2. These radio frames are stored to respective sections of the next memory bank n+1.

Similarly, the start of radio frames 1A3, 2B2, and 3A1 received for physical channels 1, 2, and 3, respectively, occurs between frame indices n+2 and n+3. These radio frames are stored to respective sections of the next memory bank n+3. The data storage process continues in this manner.

The number of memory banks required to store the received symbols is determined by various factors such as, for example, the longest supported interleaving interval (e.g., 80 msec for the W-CDMA system), the time it takes to decode the symbols, the transport format combination (TFC) set, and other factors. For the W-CDMA system, a traffic can be interleave over 1, 2, 4, or 8 radio frames. Since one memory bank is associated with each radio frame, eight memory banks can be provided to support the longest interleaving interval of 8 radio frames. The decoding of a traffic is not started until all radio frames for that traffic are received and de-interleaved. To avoid writing symbols for a new traffic over symbols that have been received for a previous traffic but not yet processed, one or more additional memory banks can be provided. While symbols from a received traffic are being processed, the symbols for the new traffic can be written to other memory banks. As an example, the number of required memory banks for the W-CDMA system can be expressed as:

$$N_B = 8 + \left\lceil \frac{\text{decoding time}}{10 \text{ msec}} \right\rceil, \quad \text{Eq (1)}$$

where "⌈ ⌉" denotes a ceiling operator (e.g., ⌈5.2⌉=6). For example, if the worse case decoding time for a traffic is 18 msec, then two additional memory banks can be provided (for a total of 10 memory banks).

The radio frame intervals can be demarcated using various techniques. In an embodiment, the frame indices (n, n+1, n+2, etc.) are marked based on a timing signal generated by a searcher element used to search for the strongest received signal instances. The search element processes the received signal at various time offsets (e.g., as directed by a controller) and identifies a particular time offset of the received signal that results in a strong correlation. The timing signal can be generated, for example, based on the earliest arriving signal instance being processed. This implementation can reduce the processing delays since the radio frames for the physical channels are more likely to be written to the same memory bank. However, the timing signal can also be based on any other signal instance being processed (e.g., the strongest signal instance), or based on some other criteria.

The data buffer structure of the invention, whereby symbols are stored to memory banks assigned to each radio frame interval, can be used to efficiently achieve other signal processing required at the receiver unit, such as the second de-interleaving 252 through the first de-interleaving 264 in FIG. 2B. The signal processing performed at the transmitter unit and the use of the memory banks to achieve the complementary signal processing at the receiver unit are described below sequentially for each of the processing, from the second de-interleaving 252 through the first de-interleaving 264 in FIG. 2B.

Second interleaving 238 for the W-CDMA system is achieved at the transmitter unit by writing the data bits for each frame of each physical channel row-by-row, permutating the columns, and reading the data bits column-by-column. Specifically, the data bits $u_1, u_2, u_3$, and so on, are written by rows to 30 columns as follows:

$$\begin{bmatrix} u_1 & u_2 & u_3 & \cdots & u_{30} \\ u_{31} & u_{32} & u_{33} & \cdots & u_{60} \\ \vdots & \vdots & \vdots & \cdots & \vdots \\ u_{30R-29} & u_{30R-29} & u_{30R-27} & \cdots & u_{30R} \end{bmatrix}.$$

The number of rows R used for each radio frame is dependent on the number of data bits to be transmitted for the radio frame. After all data bits have been written, the columns are then rearranged in accordance with the permutation pattern shown in Table 1. For example, the original column 0 is left alone, the original column 1 is move to column 12, the original column 2 is moved to column 25, the original column 3 is moved to column 6, and so on.

TABLE 1

Second Interleaving Inter-column Permutation Pattern

| | |
|---|---|
| Input column order | 0 1 2 3 4 5 6 7 8 9 10 11 12 13 14 15 16 17 18 19 20 21 22 23 24 25 26 27 28 29 |
| Permutated column order | 0 20 10 5 15 25 3 13 23 8 18 28 1 11 21 6 16 26 4 14 24 19 9 29 12 2 7 22 27 17 |

After the columns have been permutated, the data bits are read out by columns as follows:

$$\begin{bmatrix} y_1 & y_{R+1} & y_{2R+1} & \cdots & y_{29R+1} \\ y_2 & y_{R+2} & y_{2R+2} & \cdots & y_{29R+2} \\ \vdots & \vdots & \vdots & \cdots & \vdots \\ y_R & y_{2R} & y_{3R} & \cdots & y_{30R} \end{bmatrix}$$

At the transmitter unit, the number of data bits for the radio frame may not be equal to 30·R. Bits not in the original sequence are pruned (i.e., deleted) and not transmitted.

Second de-interleaving 252 can be achieved at the receiver unit by writing the received symbols for each physical channel to the memory bank in a permutated order complementary to that used at the transmitter unit to achieve the second interleaving. If 30·R symbols (or less) are received for a radio frame of a physical channel and are to be written to locations 1 through 30·R in a memory bank, the symbols can be written to permutated locations in the memory bank as follows. The first R received symbols corresponding to column 0 can be written to memory locations corresponding to column 0 (i.e., 1, 31, 61, . . . and 30·R-29) since this column has not been moved. The second R received symbols corresponding to column 1 can be written to memory locations corresponding to column 20 (i.e., 21, 51, 81, . . . and (30·R-29)+20). The third R received symbols corresponding to column 3 can be written to memory locations corresponding to column 10 (i.e., 11, 41, 71, . . . and (30·R-29)+10). The writing process continues until all symbols for the radio frame of the physical channel are written to the memory bank. These symbols can then be read from the memory bank in sequential order, from memory locations 1 through 30·R. The memory addresses for the write operations can be generated by an address generator, as described below.

Second de-interleaving 252 also accounts for bits that have been pruned in second interleaving 238. The receiver unit has knowledge of the total number of bits (NPhCH) transmitted in each radio frame, and can therefore write the received symbols to the proper locations of the memory bank based on its knowledge of NPhCH. For example, if 40 bits are transmitted for a particular radio frame, the receiver unit knows that 40 symbols are to be received and stored to memory locations 0 through 39. The first and second received symbols are stored to locations 0 and 30, respectively (column 0). The third received symbol is stored to location 20 (column 1). The fourth received symbol cannot be stored to location 50 (i.e., 50>39), and is instead stored to location 10 (column 2). The writing of symbols proceeds in similar manner until all received symbols are stored to their proper locations in the memory bank.

Physical channel segmentation 236 is performed at the transmitter unit if more than one physical channel are used for transmission. The data bits for a particular coded composite transport channel (CCTrCH) are segmented (i.e., divided) into multiple radio frames that are then transmitted via multiple physical channels. Specifically, the data bits $x_1$, $x_2$, $x_3$, and so on, for a particular CCTrCH are segmented as follows:

$$\begin{aligned} u_{1k} &= x_k & k &= 1, 2, \ldots, U \\ u_{2k} &= x_{k+U} & k &= 1, 2, \ldots, U \\ &\cdots \\ u_{Pk} &= x_{k+(P-1)U} & k &= 1, 2, \ldots, U \end{aligned} \quad \text{Eq (2)}$$

wherein $u_{1k}$, $u_{2k}$, through $U_{Pk}$ denote the data bits for physical channels 1, 2, through P, respectively.

Physical channel concatenation 254 is performed at the receiver unit to reverse the physical channel segmentation. In accordance with the W-CDMA standard, the physical channels that comprise a CCTrCH are synchronized and are identified through their channelization codes (i.e., the OVSF code). The symbols for the physical channels can be concatenated by simply writing the symbols for consecutive physical channels associated with a particular CCTrCH to contiguous sections of the memory bank. For example, if three physical channels are received for a particular CCTRCH, the U symbols received for physical channel 1 can be written to locations 1 through U in the memory bank, the U symbols received for physical channel 2 can be written to locations U+1 through 2U, and the U symbols received for physical channel 3 can be written to locations 2U+1 through 3U. A mechanism used to generate the proper memory addresses for the physical channels is described below. By writing the received symbols for consecutive physical channels of a particular CCTrCH into contiguous sections of the memory, the physical channels can be concatenated without additional processing.

Transport channel multiplexing 232 is performed at the transmitter unit to combine radio frames from all transport channels. For each radio frame interval, one radio frame from each transport channel is multiplexed into a coded composite transport channel. Specifically, the data bits $f_{1k}$, $f_{2k}$, through $f_{1k}$, for transport channels 1, 2, through I, respectively, are serially concatenated as follows:

$$\begin{aligned} s_k &= f_{1k} & k &= 1, 2, \ldots, V_1 \\ s_k &= f_{2,(k-V_1)} & k &= V_1+1, V_1+2, \ldots, V_1+V_2 \\ &\cdots \\ s_k &= f_{I,(k-X)} & k &= X+1, X+2, \ldots, X+V_I; \quad X = (V_1+V_2+\ldots+V_{I-1}). \end{aligned} \quad \text{Eq (3)}$$

Transport channel demultiplexing 258 is performed at the receiver unit to reverse the transport channel multiplexing 232. The symbols for the transport channels can be demultiplexed (i.e., segmented) by simply maintaining a list of starting memory addresses for the transport channels for each of the memory banks. As noted in equation (3), each transport channel can include any number of symbols. The starting memory addresses for the transport channels can be computed to account for this. For example, if $V_1$, $V_2$, and $V_3$ symbols are received for transport channels 1, 2, and 3, respectively, and are written to locations 1 through $V_1+V_2+$ $V_3$ of a memory bank, the starting memory addresses for transport channels 1, 2, and 3 can be computed as 1, $V_1+1$, and $V_1+V_2+1$, respectively. These starting memory addresses are later used to retrieve the proper symbols for each traffic from the memory banks.

Radio frame segmentation 224 is performed at the transmitter unit if the TTI is longer than 10 msec. The input bit sequence for a longer TTI is segmented and mapped into a number of consecutive radio frames, with the number of radio frames being dependent on the particular TTI. Specifically, data for TTIs of 10 msec, 20 msec, 40 msec, and 80 msec is mapped into 1, 2, 4, and 8 radio frames, respectively.

Radio frame concatenation 262 can be easily achieved at the receiver unit with the data buffer structure of the invention. As noted above, each memory bank is configured to store symbols corresponding to one radio frame interval. The received symbols for traffics having TuIs of 10 msec, 20 msec, 40 msec, and 80 msec are thus stored to 1, 2, 4, and 8 consecutive memory banks, respectively. The radio frames for a particular traffic can be concatenated by simply retrieving symbols from a number of memory banks used to store the radio frames for the traffic.

In accordance with the W-CDMA standard, the number of bits transmitted per transport channel is a time varying parameter and is signaled to the receiver unit (i.e., the user equipment, or UE) through a transport format combination indicator (TFCI) that is transmitted on a physical channel. By reading only symbols from the data buffer that correspond to a particular transport channel, the DTX removal (first and second), transport channel demultiplexing, and radio frame concatenation can be achieved without extra processing.

First interleaving 222 for the W-CDMA system is achieved by writing the data bits for each traffic row-by-row, permutating the columns (if necessary, for some TTIs), and reading the data bits column-by-column. Specifically, the data bits $h_1$, $h_2$, $h_3$, and so on, are written by rows to C columns as follows:

$$\begin{bmatrix} h_1 & h_2 & h_3 & \cdots & h_C \\ h_{C+1} & h_{C+2} & h_{C+2} & \cdots & h_{2C} \\ \vdots & \vdots & \vdots & \cdots & \vdots \\ h_{(R-1)C+1} & h_{(R-1)C+2} & h_{(R-1)C+3} & \cdots & h_{RC} \end{bmatrix}.$$

In accordance with the W-CDMA standard, the number of columns C used is dependent on the TTI (i.e., 1, 2, 4, and 8 columns are used for TTIs of 10 msec, 20 msec, 40 msec, and 80 msec, respectively). The number of rows R used for each traffic is dependent on the number of data bits to be transmitted for the traffic and the number of column used (i.e., R=X/C, where X is the number of bits to be transmitted for the traffic). After all data bits have been written, the Acolumns are then rearranged in accordance with the permutation patterns shown in Table 2. For example, for a TTI of 80 msec, the original column 0 is left alone, the original column 1 is move to column 4, the original column 2 is left alone, the original column 3 is moved to column 6, and so on.

TABLE 2

| TTI | Inter-column Permutation Pattern |
|---|---|
| 10 msec | 0 |
| 20 msec | 0 1 |
| 40 msec | 0 2 1 3 |
| 80 msec | 0 4 2 6 1 5 3 7 |

After the columns have been permutated, the data bits are read out by columns as follows:

$$\begin{bmatrix} q_1 & q_{R+1} & q_{2R+1} & \cdots & q_{(C-1)R+1} \\ q_2 & q_{R+2} & q_{2R+2} & \cdots & q_{(C-1)R+2} \\ \vdots & \vdots & \vdots & \cdots & \vdots \\ q_R & q_{2R} & q_{3R} & \cdots & q_{CR} \end{bmatrix}.$$

As shown in Table 2, the number of columns matches the number of radio frames used for the TTI. For example, for a traffic having a TTI of 80 msec, the first radio frame of the traffic includes data bits from column 0, the second radio frame includes data bits from column 4, the second radio frame includes data bits from column 4, and so on. This characteristic can be exploit to perform the de-interleaving at the receiver unit.

First de-interleaving 264 can be achieved at the receiver unit by reading the received symbols for each traffic from the memory banks in a permutated order complementary to that used at the transmitter unit to achieve the first interleaving. Specifically, if R·C received symbols for a particular traffic have been stored to locations 1 through R in each of C memory banks, where C is the number of radio frames used for the traffic, the symbols can be read from sequential locations from the C memory banks in permutated order to achieve the first de-interleaving.

Figure 4:
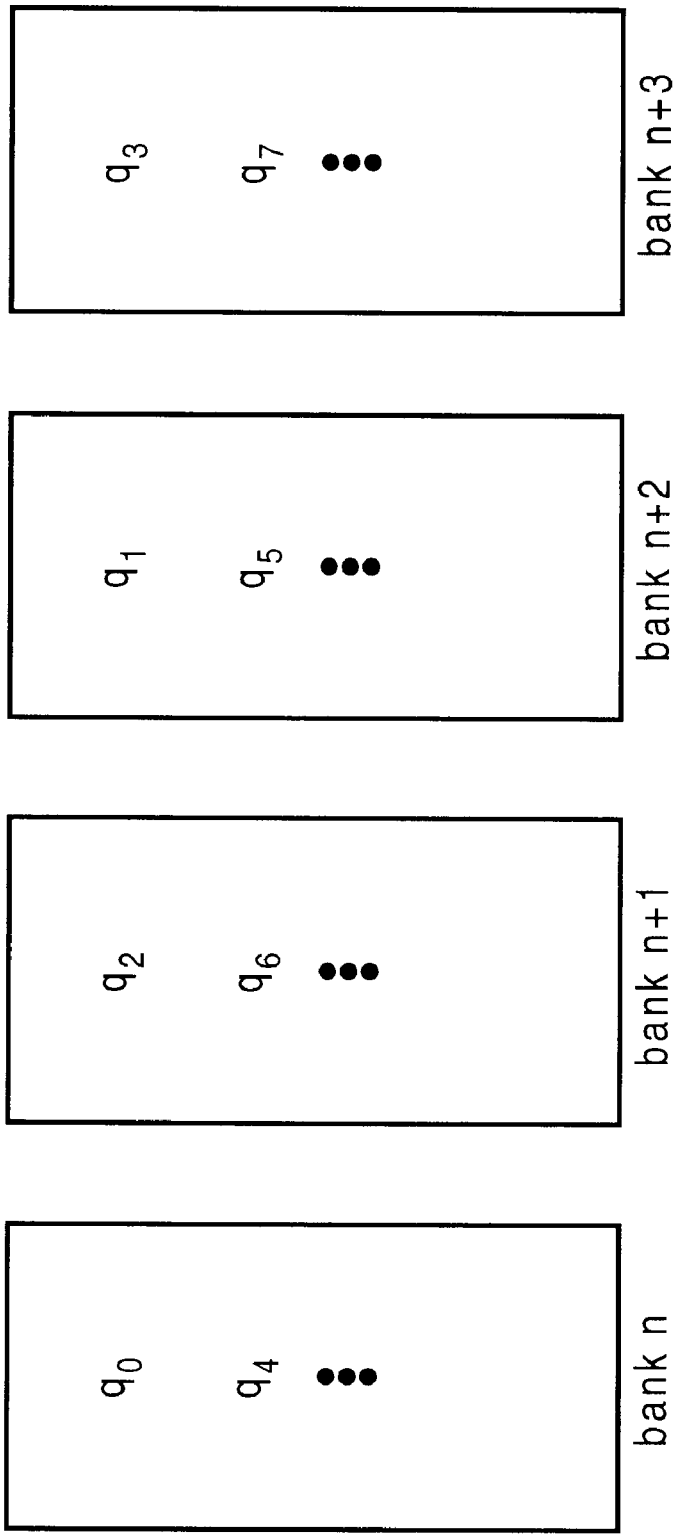
FIG. 4 is a diagram that graphically illustrates the retrieval of symbols from four memory banks in a permutated order to achieve de-interleaving.

FIG. 4 is a diagram that graphically illustrates the retrieval of symbols from four memory banks (for a TTI of 40 msec) in a permutated order to achieve the first de-interleaving 264. As shown in this specific example, the symbols are stored to memory banks n through n+3. Also, referring to Table 2, the permutation pattern for a TTI of 40 msec is {0 2 1 3}. Thus, the first symbol is retrieved from the first location in memory bank n, the second symbols is retrieved from the first location in memory bank n+2, the third symbol is retrieved from the first location in memory bank n+1, the fourth symbol is retrieved from the first location in memory bank n+3, the fifth symbol is retrieved from the second location in memory bank n, and so on.

As another specific example, if the symbols for a traffic with a TTI of 80 msec have been stored to locations 1 through R in each of memory banks 0 through 7, the first eight symbols can be retrieved from location 1 in memory banks 0, 4, 2, 6, 1, 5, 3, and 7; the $9^{th}$ through $16^{th}$ symbols can be respectively retrieved from location 2 in memory banks 0, 4, 2, 6, 1, 5, 3, and 7; the $17^{th}$ through $24^{th}$ symbols can be respectively retrieved from location 3 in memory banks 0, 4, 2, 6, 1, 5, 3, and 7; and so on.

Generally, the first de-interleaving for a particular traffic can be achieved by identifying: (1) the memory banks used to store the symbols for the traffic, (2) the starting memory address for the traffic for each of the identified memory banks, and (3) the permutation pattern used for the traffic. On the first read pass, one symbol is retrieved from each of the memory banks at a "base" memory address. On each subsequent read pass, the base memory address is updated (i.e., incremented), and one symbol is retrieved from each of the memory banks at the updated memory address. The radio frame concatenation is also achieved in conjunction with the de-interleaving by reading from multiple memory banks used for the traffic.

As can be appreciated from the above, the data buffer structure of the invention, wherein a memory bank is used to stored symbols associated with each radio frame interval, results in an efficient memory design and further simplifies many of the signal processing required at the receiver unit. The size of each memory bank is determined by the peak bit rate to be supported by the receiver unit. The use of the memory bank simplifies the first and second de-interleaving, as described above. The physical channel concatenation, transport channel demultiplexing, and radio frame concatenation are also simplified with the use of the data buffer structure of the invention.

Figure 5:
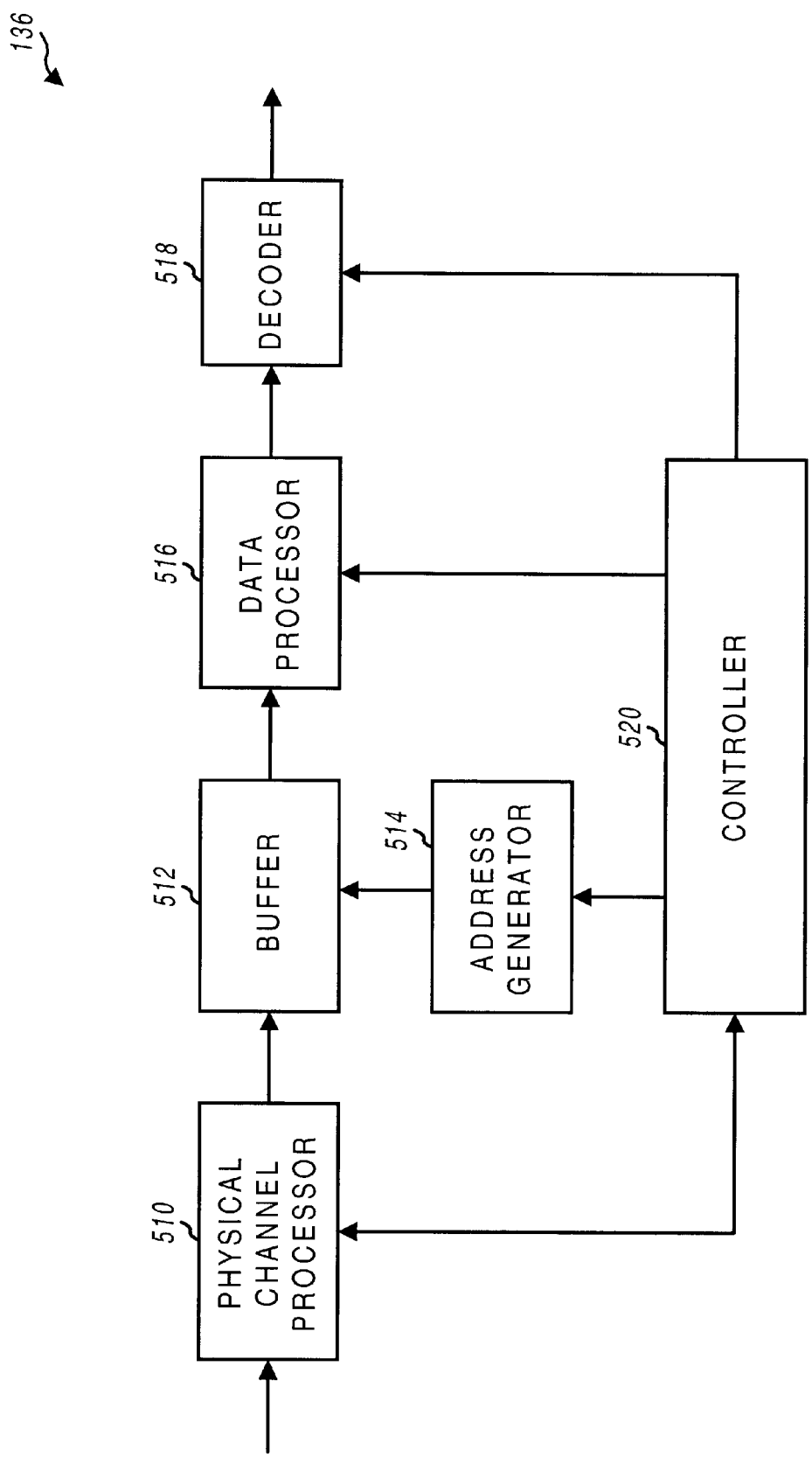
FIG. 5 is a simplified block diagram of an embodiment of a receive data processor suitable for processing a downlink data transmission.

FIG. 5 is a simplified block diagram of an embodiment of receive data processor 136, which is suitable for processing a downlink data transmission in accordance with the W-CDMA standard. Receive data processor 136 can be used to perform some of the signal processing described above in FIG. 2B. The received signal is conditioned and digitized within receiver 134 to provide digitized samples. A physical channel processor 510 then receives and processes the samples to generate symbols for one or more physical channels. The processing typically includes despreading, decovering, and pilot demodulation, as described in U.S. patent application Ser. No. xx/xxx,xxx [Attorney Docket No. PD000442], entitled "METHOD AND APPARATUS FOR PROCESSING A PHYSICAL CHANNEL WITH PARTIAL TRANSPORT FORMAT INFORMATION," filed on same day herewith, U.S. Pat. No. 5,764,687, entitled "MOBILE DEMODULATOR ARCHITECTURE FOR A SPREAD SPECTRUM MULTIPLE ACCESS COMMUNICATION SYSTEM," and U.S. Pat. No. 5,490,165, entitled "DEMODULATION ELEMENT ASSIGNMENT IN A SYSTEM CAPABLE OF RECEIVING MULTIPLE SIGNALS," all assigned to the assignee of the present invention and incorporated herein by reference.

When all radio frames for a particular traffic have been received, physical channel processor 510 signals a controller 520, which then schedules the processing (e.g., inverse rate matching, decoding) of the symbols in the traffic. The symbols in buffer 512 are retrieved by a data processor 516 in a first permutated order to achieve the first de-interleaving. Data processor 516 then performs the inverse rate matching complementary to the rate matching performed in block 218. The symbols are then provided to a decoder 518.

Decoder 518 performs decoding in a manner complementary to the coding scheme used at the transmitter unit. Specifically, decoder 518 performs Viterbi decoding for convolutionally coded data, Turbo decoding for Turbo coded data, or no decoding or non-coded data. A CRC checker within decoder 518 typically further performs error detection based on the appended CRC bits. Decoder 518 then provides the decoded data to the data sink.

Referring back to FIG. 2B, the processing from second de-interleaving 252 to first de-interleaving 264 can be efficiently achieved by properly managing buffer 512. Specifically, the second de-interleaving 252 can be achieved by writing the symbols to buffer 512 in a second permutated order that is complementary to that performed for the second interleaving 238. The first de-interleaving 264 can be achieved by reading the symbols from buffer 512 in a first permutated order that is complementary to that performed for the first interleaving 222. The physical channel concatenation 254 can be achieved by writing symbols for consecutive physical channels associated with the same CCTrCH to contiguous sections of buffer 512. The transport channel demultiplexing 258 can be achieved by computing starting memory addresses for the memory banks used to store the symbols for each transport channel. And the radio frame concatenation 262 is achieved (automatically) by retrieving symbols from the one or more memory banks used for each traffic.

In an embodiment, buffer 512 is implemented with a number of memory banks as determined, for example, using equation (1). The memory banks can be implemented using various memory structures. For example, the memory banks may be implemented using separate memory units, with a multi-port memory unit, with a memory unit that is partitioned into a number of sections operated as a number of memory banks, or using other structures. These and other memory structures used to implement buffer 512 are within the scope of the invention.

The size of each memory bank is dependent on the maximum throughput to be supported by the receiver unit. As a specific example, to support a single downlink shared channel (DSCH) with a spreading factor of 4, each memory bank can be designed to store 9.6K symbols (i.e., 38.4K chips per radio frame interval/4 chips per symbol for a spreading factor of 4). Other memory sizes can also be supported and are within the scope of the invention.

In a specific implementation, each memory bank is implemented with two "half-banks" capable of supporting both read and write operations. While new symbols are written to one of the half-banks, stored symbols can be read from the other half-bank. The two half-banks may be implemented with two separate memory units, with two sections of a memory bank (e.g., odd-address and even-address sections, top and bottom halves, and others), or with other memory structures. The two half-banks can also be implemented such that they can be independently accessed. This architecture allows each half-bank to be read from, or written to, independently of the other half-bank. With this architecture, a read/write, write/read, read/read, or write/write can be performed on the two half-banks.

As shown in FIG. 5, an address generator 514 is provided to compute the addresses for write and read operations for buffer 512. Address generator 514 can be implemented as a separate unit, integrated within controller 520, or implemented within an ASIC that also includes the other processing units.

In an embodiment, address generator 514 includes a first data structure used to manage the current memory bank. The first data structure can include a first entry that identifies the current memory bank to be used for the current radio frame interval and a second entry that keeps track of the number of symbols to be stored to the memory bank for the current radio frame interval. At the start of each new radio frame interval, the first entry is updated to the next memory bank and the second entry is reset to zero.

In an embodiment, the $N_B$ memory banks are used in a circular fashion. The first entry of the first data structure is incremented from 0 through $N_{B-1}$ for each new radio frame interval, then back to zero for the next radio frame interval, and incremented again for each new radio frame interval. In an embodiment, the second entry is updated as each a new physical channel is ireceived and processed. For most types of physical channel, the size of the physical channel (i.e., the number of bits being transmitted) is known at setup and does not change. The physical dedicated shared channel (PDSCH) has time-varying size, but the change in size is signaled ahead of when the change takes place. For the example shown in FIG. 3, the second entry for memory bank n is set to $V_1$ when physical channel 1 is received starting within radio frame interval n, then set to $V_1+V_2$ when physical channel 2 is received starting within the same radio frame interval. Other techniques to manage the memory banks can also be used and are within the scope of the invention.

In an embodiment, address generator 514 includes a second data structure used to store the starting memory addresses of the physical channels and the transport channels for each of the $N_B$ memory banks. Referring back to FIG. 3, symbols from the physical channels are stored to the memory banks based on the temporal order in which the channels are received. Thus, the symbols for a particular physical channel can be stored to different sections of the memory banks used for that physical channel, depending on which physical channels are also received and their temporal order. The starting memory addresses stored in the second data structure allow the symbols for each physical channel to be written to different sections of the memory banks. These starting memory addresses are added to the computed addresses to generate the final addresses indicative of the locations in the memory banks to store the symbols.

Address generator 514 may further include a third data structure used to store the starting memory address of the next code block to be processed for each traffic. These code block starting addresses may be used, for example, if the decoding of code blocks for a particular traffic can be interrupted to decode the code blocks for another traffic having a higher priority.

Figure 6:
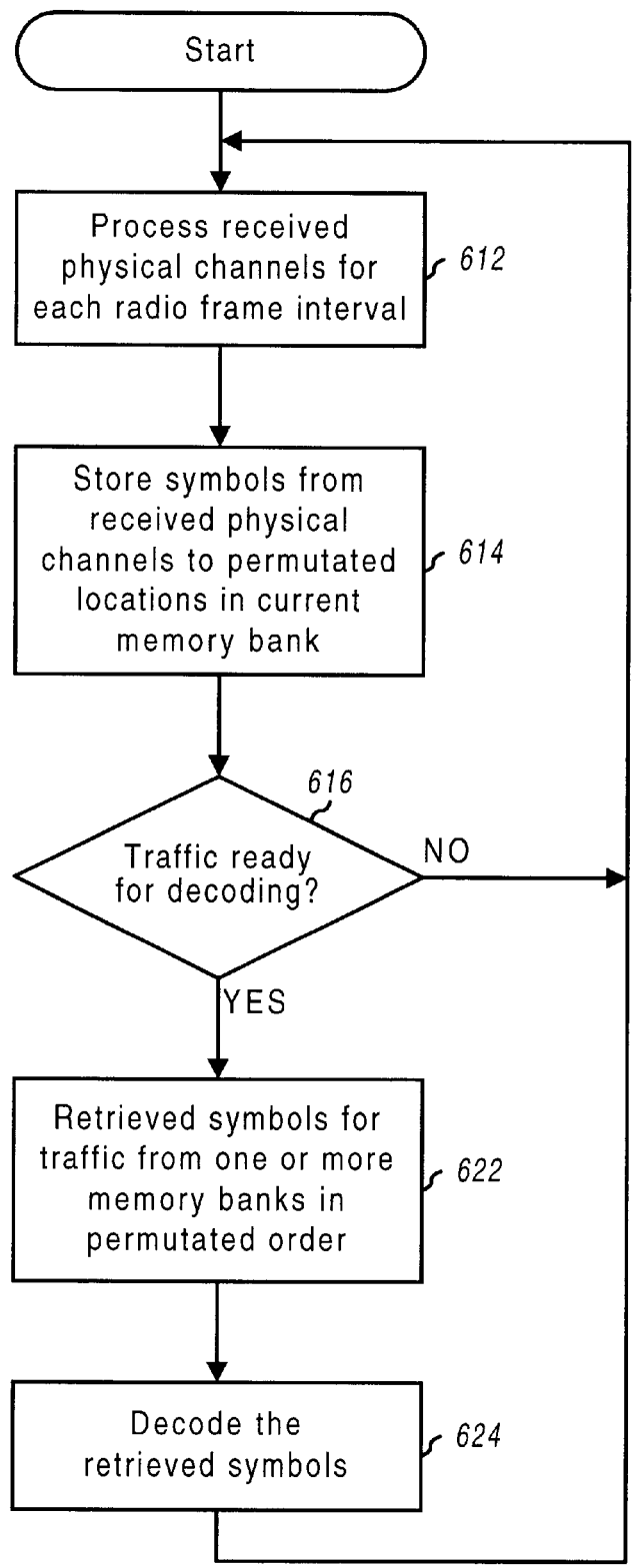
FIG. 6 is a flow diagram of a specific embodiment of the signal processing performed at the receiver unit for a downlink data transmission.

FIG. 6 is a flow diagram of a specific embodiment of the signal processing performed at the receiver unit for a data transmission. For each radio frame interval, zero or more physical channels are received and processed, at step 612, to generate symbols that are then stored, at step 614, to permutated locations in a current memory bank associated with the radio frame interval. The processing to be performed for the physical channel can be based on the particular system or standard being implemented. For example, the permutated locations can be selected to achieve the second de-interleaving for the W-CDMA system. Periodically or when indicated by the processor used to process the physical channels, a determination is made whether a traffic is ready for decoding, at step 616. If no traffics are ready for decoding, the process returns to step 612.

Otherwise, if a traffic is ready for decoding, the symbols for the traffic is retrieved from one or more memory banks in permutated order, at step 622. The permutated order can be selected to achieve the first de-interleaving for the W-CDMA system. The retrieved symbols are then decoded to recover the transmitted data, at step 624. The process then returns to step 612.

Figure 7:
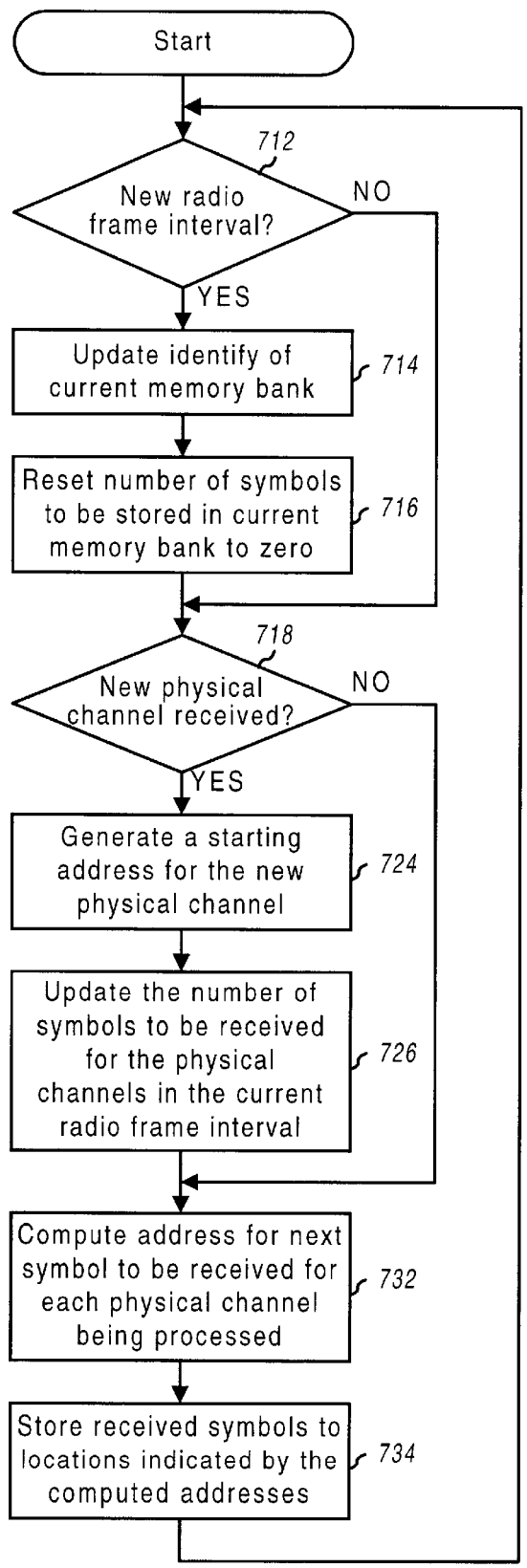
FIG. 7 is a flow diagram of a specific embodiment of the process to store symbols in the memory banks.

FIG. 7 is a flow diagram of a specific embodiment of the process to store symbols in the memory banks, which is performed at step 614 in FIG. 6. Initially, a determination is made whether a new radio frame interval has commenced, at step 712. If a new radio frame interval has commenced, the identity of the current memory bank is updated, at step 714. This can be achieved, for example, by incrementing a modulo-$N_B$ counter used to identify the current memory bank. Thereafter, a radio frame received starting within this radio frame interval is stored to the current memory bank. The number of symbols to be stored in the current memory bank is also reset to zero, at step 716. Steps 714 and 716 are bypassed if a new radio frame interval has not commenced.

A determination is next made whether a new physical channel has been received, at step 718. If a new physical channel has been received, the starting memory address for the new physical channel is computed, at step 722. The number of symbols to be received for all physical channels in the current radio frame interval is also updated to reflect the new physical channel, at step 724. This can be achieved by adding the number of symbols to be received for the new physical channel with the prior number of symbols to be received for other physical channel(s). Steps 722 and 724 are skipped if a new physical channel has not been received.

For each physical channel being received and processed, a memory address is computed for the next received symbol, at step 732. The computed memory address for each physical channel takes into account the starting memory address of the physical channel and the permutation in the memory locations to achieve de-interleaving. The received symbols are stored to the memory locations indicated by the computed addresses, at step 734. The process then returns to step 712.

The processing units described herein (e.g., the physical channel processor, data processor, decoder, controller, and others) can be implemented in various manners. For example, each of these processing units can be implemented in an application specific integrated circuit (ASIC), a digital signal processor, a microcontroller, a microprocessor, or other electronic circuits designed to perform the functions described herein. The processing units can also be integrated into one or more integrated circuits. Also, the processing units can be implemented with a general-purpose or specially designed processor operated to execute instruction codes that achieve the functions described herein. Thus, the processing units described herein can be implemented using hardware, software, or a combination thereof.

The data buffer structure of the invention (e.g., buffer 514) can be implemented with various memory technologies such as, for example, random access memory (RAM), Flash memory, and others. Various other implementation of the memory units are possible and within the scope of the present invention.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A receiver unit operative to process data transmissions in a communications system, comprising:
   a channel processor operative to process samples for one or more physical channels for each time interval to provide symbols;
   a buffer coupled to the channel processor and operated as a plurality of memory banks, wherein each memory bank is associated with a respective time interval and operative to store symbols associated with that time interval; and
   a data processor coupled to the buffer and operative to retrieve symbols for a particular traffic from one or more memory banks and to process the retrieved symbols.

2. The receiver unit of claim 1, wherein a radio frame of symbols is received for each physical channel for each time interval, and wherein each radio frame received starting within a particular time interval is stored to a designated section of the memory bank associated with that time interval.

3. The receiver unit of claim 2, wherein symbols in each radio frame are stored to permutated locations of the designated section to achieve a second de-interleaving.

4. The receiver unit of claim 2, wherein radio frames for physical channels associated with a particular coded composite transport channel are stored to contiguous sections of the memory bank.

5. The receiver unit of claim 1, wherein the data processor is operative to retrieve symbols from at least two memory banks in permutated order to achieve a first de-interleaving.

6. The receiver unit of claim 5, wherein at least two memory banks are used to store symbols for the particular traffic, and wherein the data processor is operative to retrieve one symbol from each of the at least two memory banks based on a particular permutation pattern.

7. The receiver unit of claim 5, wherein four memory banks, n through n+3, are used to store symbols for the particular traffic, and wherein the data processor is operative to sequentially retrieve one symbol from memory banks n, n+2, n+1, and n+3 for each pass through the memory banks.

8. The receiver unit of claim 5, wherein eight memory banks, n through n+7, are used to store symbols for the particular traffic, and wherein the data processor is operative to sequentially retrieve one symbol from memory banks n, n+4, n+2, n+6, n+1, n+5, n+3, and n+7 for each pass through the memory banks.

9. The receiver unit of claim 1, wherein the buffer includes at least eight memory banks used to store symbols associated with at least eight consecutive time intervals.

10. The receiver unit of claim 1, wherein each memory bank includes two half-banks operated to allow writing of symbols to one half-bank and reading of symbols from the other half-bank.

11. The receiver unit of claim 10, wherein one half-bank of each memory bank is associated with odd memory addresses and the other half-bank is associated with even memory addresses.

12. The receiver unit of claim 1, further comprising:
an address generator coupled to the buffer and operative to provide memory addresses for writing symbols to the memory banks and reading symbols from the memory banks.

13. The receiver unit of claim 12, wherein the address generator is operative to maintain a first data structure having a first entry that identifies a particular memory bank associated with a current time interval.

14. The receiver unit of claim 13, wherein the first data structure further includes a second entry that identifies the number of symbols to be stored to the particular memory bank for the current time interval.

15. The receiver unit of claim 12, wherein the address generator is operative to maintain a second data structure having entries that identify a starting memory address for each physical channel being processed.

16. The receiver unit of claim 1, further comprising:
a controller coupled to the channel processor and the data processor, the controller operative to direct storage of symbols to the memory banks and retrieval of symbols from the memory banks.

17. The receiver unit of claim 1, further comprising:
a decoder coupled to the data processor and operative to receive and decode symbols processed by the data processor.

18. The receiver unit of claim 1, wherein each time interval corresponds to a radio frame interval of 10 msec.

19. The receiver unit of claim 1, wherein each time interval is demarcated by a timing signal generated by the receiver unit.

20. The receiver unit of claim 19, wherein the timing signal is generated based on a signal instance being processed.

21. The receiver unit of claim 1, wherein the communications system conforms to W-CDMA standard.

22. A receiver unit operative to process data transmissions in a communications system, comprising:
a channel processor operative to process samples for one or more physical channels for each radio frame interval to provide symbols, wherein a radio frame of symbols is provided for each physical channel for each radio frame interval;
a buffer coupled to the channel processor and operated as a plurality of memory banks, wherein each memory bank is associated with a respective radio frame interval, wherein each radio frame received starting within a particular radio frame interval is stored to a designated section of the memory bank associated with that radio frame interval, and wherein the symbols for each radio frame are stored to permutated locations in the designated section;
a data processor coupled to the buffer and operative to retrieve symbols for a particular traffic from one or more memory banks in permutated order and to process the retrieved symbols;
a decoder coupled to the data processor and operative to receive and decode symbols processed by the data processor; and
a controller coupled to the channel processor and the data processor, the controller operative to direct storage of symbols to the memory banks and retrieval of symbols from the memory banks.

23. A buffer structure for storing symbols in a communications system, the buffer structure comprising:
a plurality of memory banks, each memory bank associated with a respective time interval and operative to store symbols for the associated time interval in permutated locations of the memory bank to achieve a second de-interleaving, wherein symbols are retrieved from one or more memory banks in permutated order to achieve a first de-interleaving; and
an address generator coupled to the buffer and operative to provide memory addresses for writing symbols to the memory banks and reading symbols from the memory banks.

24. The buffer structure of claim 23, wherein at least eight memory banks are operative to store symbols for at least eight consecutive time intervals.

25. The buffer structure of claim 23, wherein each memory bank is sized to store all symbols expected to be received from all physical channels for the associated time interval.

26. The buffer structure of claim 23, wherein each memory bank includes two half-banks operated to allow writing of symbols to one half-bank and reading of symbols from the other half-bank.

27. A method for processing data transmissions in a communications system, the method comprising:
receiving and processing samples for one or more physical channels for each time interval to provide symbols;
storing symbols associated with each time interval to a memory bank associated with that time interval;
retrieving symbols for a particular traffic from one or more memory banks; and processing the retrieved symbols for the particular traffic.

28. The method of claim 27, further comprising:

establishing a timing signal used to demarcate each time interval.

29. The method of claim 27, wherein the timing signal is established based on a signal instance being processed.

30. The method of claim 27, wherein each time interval corresponds to a radio frame interval of 10 msec.

31. The method of claim 27, wherein a radio frame of symbols is received for each physical channel for each time interval, and wherein each radio frame received starting within a particular time interval is stored to a designated section of the memory bank associated with that time interval.

32. The method of claim 31, wherein radio frames for physical channels associated with a particular coded composite transport channel are stored to contiguous sections of the memory bank.

33. A method for processing data transmissions in a communications system, the method comprising:

establishing a timing signal used to demarcate radio frame intervals;

receiving and processing one or more physical channels for each radio frame interval to provide symbols, wherein a radio frame of symbols is provided for each physical channel for each radio frame interval;

associating one memory bank with each radio frame interval;

storing each radio frame received starting within a particular radio frame interval to a designated section of the memory bank associated with that radio frame interval, and wherein the symbols for each radio frame are stored to permutated locations in the designated section;

retrieving symbols for a particular traffic from one or more memory banks in permutated order; and processing the retrieved symbols for the particular traffic.

* * * * *